United States Patent [19]

Shahid

[11] Patent Number: 5,123,996

[45] Date of Patent: Jun. 23, 1992

[54] CRYSTAL GROWTH METHOD AND APPARATUS

[75] Inventor: Muhammed A. Shahid, Ewing Township, Mercer County, N.J.

[73] Assignee: AT&T Bell Laboratories, Murray Hill, N.J.

[21] Appl. No.: 646,125

[22] Filed: Jan. 28, 1991

[51] Int. Cl.$^5$ ............................................. C30B 15/00
[52] U.S. Cl. ............................. 156/620.2; 156/616.2; 156/616.3; 156/616.4; 156/616.41; 156/DIG. 98
[58] Field of Search ............... 156/616.2, 616.3, 616.4, 156/616.41, 620.2, DIG. 98

[56] References Cited

U.S. PATENT DOCUMENTS

| | | | |
|---|---|---|---|
| 4,343,662 | 8/1982 | Gay | 437/226 |
| 4,404,172 | 9/1983 | Gault | 422/248 |
| 4,946,542 | 8/1990 | Clemans | 156/616.41 |
| 4,966,645 | 10/1990 | Shahid | 156/616.4 |

OTHER PUBLICATIONS

VLSI Fabrication Principles: Silicon & Gallium Arsenide; Ghandhi; Chapter 1; Material Properties pp. 10-11; John Wiley & Sons (1983).
"Review of Chemical Polishing of Semiconductors," B. Tuck, *Journal of Materials Science*, vol. 10, 1975, pp. 321-339.

*Primary Examiner*—Robert Kunemund
*Assistant Examiner*—Felisa Garrett
*Attorney, Agent, or Firm*—R. B. Anderson

[57] ABSTRACT

In growing ingots of crystalline semiconductor material in a crucible, a seed crystal (35) contains a slot (36) which meshes with a wall portion (33) of the crucible for fixing the crystal orientation of the seed crystal with respect to the crucible. The crucible contains crystallographic reference flats (26 and 27) which are manifested as reference flats (26' and 27') of wafers cut from ingots grown in the crucible. The slots (36) in the seed crystal can be formed by forming slots (39) in a larger crystal (38) from which the seed crystals (35) are formed by coring.

31 Claims, 3 Drawing Sheets

CRYSTAL GROWTH METHOD AND APPARATUS

TECHNICAL FIELD

This invention relates to processes for making crystalline semiconductor material and, more particularly, to methods and apparatus for growing ingots of group III-V and group II-VI semiconductor compounds from which monocrystalline wafers can be cut.

BACKGROUND OF THE INVENTION

One of the most significant developments in semiconductor technology has been the increased use and importance of compound semiconductors. Particularly significant are the group III-V compounds composed of elements of groups III and V of the periodic table such as gallium arsenide and indium phosphide. Single crystals of such materials are used, for example, for making lasers, light-emitting diodes, microwave oscillators and light detectors. Also important are the II-VI materials such as cadmium sulfide which may be used for making light detectors and other devices.

Most commercial use of compound semiconductors requires the growth of large single-crystal ingots from which monocrystalline wafers can be cut for the subsequent fabrication of useful devices. The U.S. patent of Gault, U.S. Pat. No. 4,404,172, granted Sept. 13, 1983, incorporated herein by reference, describes a particularly useful method of crystal growth known as the vertical gradient freeze (VGF) method. According to this method, raw semiconductor material is placed in a vertically extending crucible including a small cylindrical seed well portion at its bottom end which snugly contains a monocrystalline seed crystal. Initially, the raw material and a portion of the seed crystal are melted. The power to the system is then reduced in such a manner that solidification, or freezing, proceeds vertically upwardly from the seed crystal, with a crystal orientation of the grown ingot corresponding to that of the seed crystal.

The U.S. patent of Shahid, U.S. Pat. No. 4,966,645, granted Oct. 30, 1990, points out that ingots grown by the VGF method should preferably be grown in the <111> direction, while the wafers from which devices are to be made should be oriented in the <100> crystallographic direction. Fulfillment of both of these conditions requires slicing of the ingot at an angle of 35.3 degrees with respect to its central axis which, if the ingot is cylindrical with a circular cross-section, results in elliptically shaped wafers. The Shahid patent points out that, by growing ingots to have an elliptical cross-section, one can obtain circularly shaped wafers which can more efficiently be converted to useful devices. For taking best advantage of this improvement, the seed crystal should be properly rotationally oriented within the seed well of the crucible. Specifically, the seed crystal should be oriented such that the line of intersection of the {100} plane with the {111} plane is parallel to the major axis of the ellipse of the crucible in which the ingot is to be grown.

After any semiconductor ingot is grown, it is customary to make on its outer surface an axially extending flat surface portion known as a "reference flat." The reference flat bears a specified relationship to the crystalline orientation of the ingot so that, after the wafers are made, the resulting flat portion on the periphery of each wafer can be used as a reference for properly orienting devices to be defined in the wafer. Crystal orientation can be determined in a number of ways, such as etching to expose crystalline planes of a semiconductor, and by various x-ray and optical diffraction techniques. Providing a reference flat on the periphery of each wafer, of course, obviates the need for such crystallographic determination methods prior to use of each wafer.

While the improvement of the Shahid patent significantly increases the efficiency with which compound semiconductor wafers can be made, there is a long-felt need in the industry for ways of reducing further the cost of making such wafers, and considerable effort to that end has been expended.

SUMMARY OF THE INVENTION

In accordance with the invention, the crystal orientation of the ingot to be grown is controlled by providing matching meshing portions in the crucible and in the seed crystal. For example, the meshing portion of the crucible may be a projecting wall portion and the meshing portion of the seed crystal may be a slot adapted to fit snugly over the wall portion. When the seed crystal is meshed in this manner with the crucible, its orientation is fixed, and the crystal orientation of the ingot to be grown is likewise fixed. One may then use a crucible having an elliptical cross-section in accordance with the Shahid patent and be assured that the grown crystal will have the proper orientation such that, when the ingot is sliced to make circular wafers, the resulting wafers will have the proper crystallographic orientation; for example, to assure that the surface of the wafers are oriented in the <100> crystallographic direction.

In accordance with another feature of the invention, one or more reference flats are made in the inner surface of the crucible. The reference flat extends axially along the major portion of the crucible such that a reference flat is formed along the usable portion of the ingot. With the seed crystal locked in place, one can assure that the reference flat is an accurate indicator of the crystallographic orientation of the ingot. The provision of this feature avoids the need for grinding a reference flat in the ingot after it has been produced.

The invention can be used in any of various ways to reduce the effort and operator skill needed for growing ingots of desired crystal orientation. These and other objects, features and benefits of the invention will be understood from a consideration of the following detailed description taken in conjunction with the accompanying drawing.

DETAILED DESCRIPTION

The aforementioned Gault patent and related prior art literature describe in detail the apparatus to be used and procedural steps to be followed in successfully growing monocrystalline III-V semiconductor ingots in accordance with the vertical gradient freeze (VGF) method. For the sake of brevity, and for the purpose of emphasizing the improvements which constitute the present invention, such details will not be repeated, it being understood that the preferred method of implementing the invention is through the use of the VGF method. It should also be understood that while terms such as "monocrystalline" and "single crystal" are used to describe ingots, most ingots contain defects or localized departures from monocrystallinity, and successful growing methods are those that reduce or minimize (not necessarily eliminate) such defects.

Figure 1:
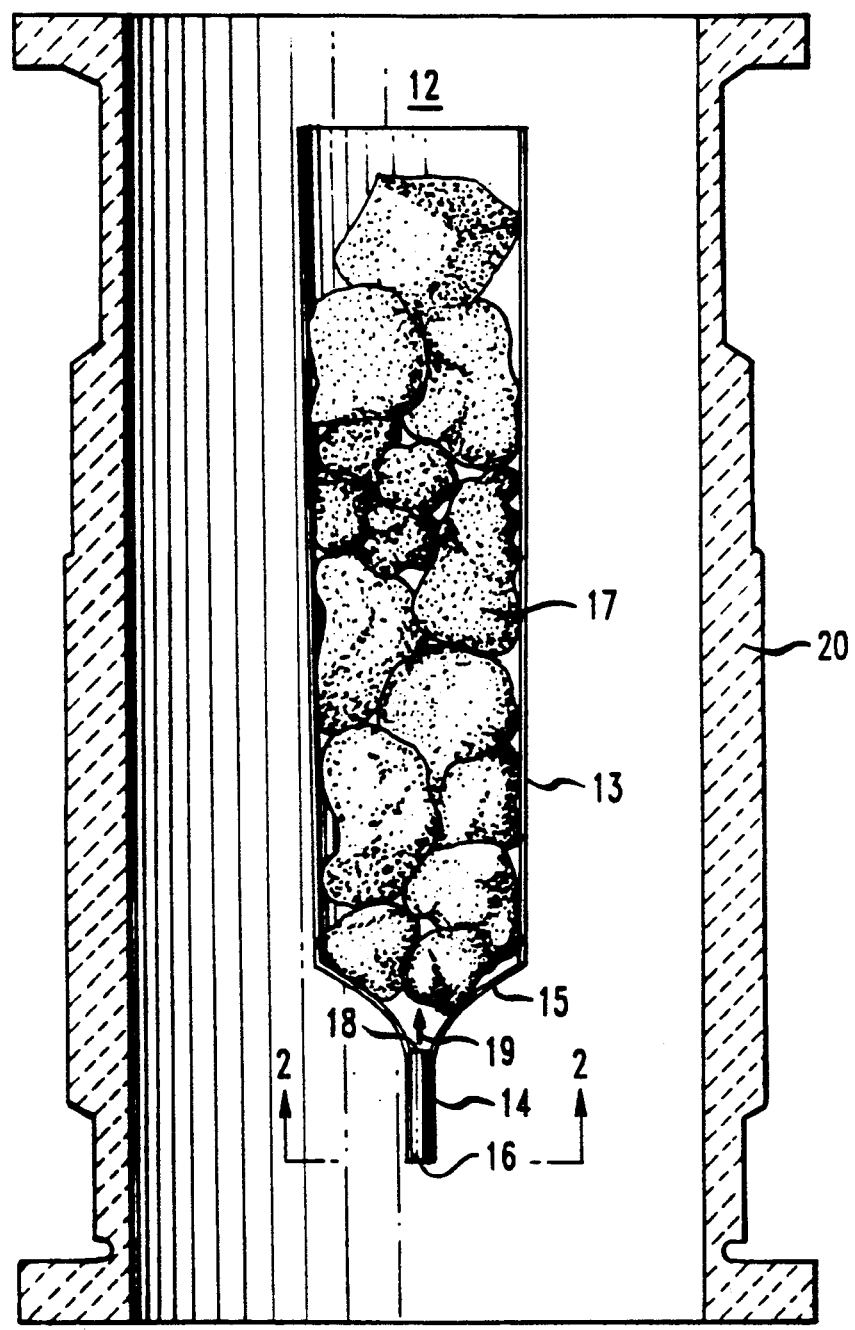
FIG. 1 is a schematic view of apparatus for making semiconductor crystalline ingots in accordance with the prior art VGF method.

Referring now to FIG. 1, the VGF method employs a vertically extending crucible 12 having a major portion 13, a cylindrical seed well portion 14 and a transition portion 15. A cylindrical monocrystalline seed crystal 16 of the semiconductor material to be grown, such as indium phosphide, is placed in the cylindrical seed well portion 14. The crucible is then nearly filled with raw material from which the ingot is to be made, such as polycrystals 17 of indium phosphide. There may also be included in the crucible a quantity of boric oxide for encapsulating the molten group III-V material, and there may also be included elemental group V material for maintaining stoichiometry of the ingot during its growth.

Heat is controllably applied to the raw material by a heater 20 which surrounds the crucible 12. All of the raw material 17 and part of the upper portion of seed crystal 16 is melted and then the power to the heater is reduced to give a predetermined temperature gradient within the crucible that causes recrystallization, or freezing, first at the interface of the melt and the seed crystal. The freezing progresses upwardly until the entirety of the molten raw material has been recrystallized into an ingot. If the process is executed with perfection, the ingot will be of a single crystal having a crystallographic orientation identical of that of the seed crystal 16. During melting and subsequent freezing of the semiconductor material, an over-pressure of gas, which may or may not include vapors of the group V element material, may be applied to the upper surface of the melt to retard the escape of vaporized group V material from the melt.

The cylindrical seed crystal 16 is preferably formed such that its upper surface 18 lies in the {111} crystallographic plane, in which case a direction perpendicular to the surface 18, as indicated by arrow 19, constitutes the <111> direction. Under these circumstances, single crystal semiconductor material growing from surface 18 of crystal 16 will grow vertically upwardly in the <111> crystallographic direction indicated by arrow 19. As is known, growth in this direction reduces stresses between the inner surface of the crucible and the ingot during growth, thus minimizing defects in the ingot. However, to obtain optimum crystal orientation for the wafers, the wafers would have to be cut at a severe angle; with cylindrical ingots, this would yield elliptical wafers.

Figure 2:
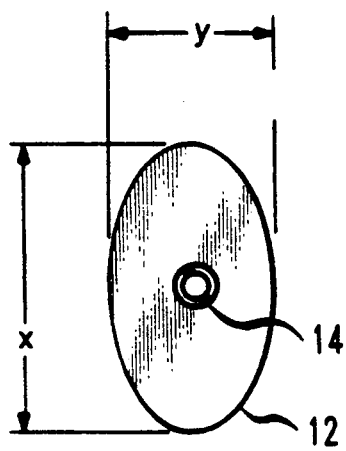
FIG. 2 is a view taken along lines 2—2 of FIG. 1.
Figure 3:
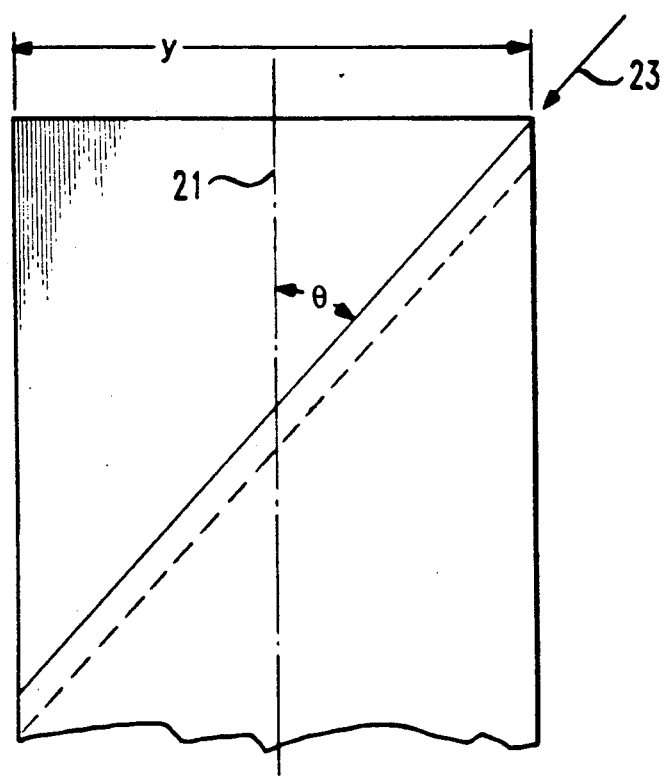
FIG. 3 is a view of part of an ingot made with the apparatus of FIG. 1.

Referring to FIG. 2, it can be seen that, in accordance with the teachings of the aforementioned Shahid patent, the cross-section of the major portion of crucible 12 has a generally elliptical shape. The reason for this shape is to grow elliptically shaped ingots which, when sliced at an appropriate angle with respect to the central axis of the ingot, give wafers having generally circular peripheries. The ellipse defined by the cross-section of the crucible has a major axis x and a minor axis y, as shown in FIG. 2. FIG. 3 shows a side view of the ingot having a central axis 21 and a minor elliptical axis y which corresponds to the y direction of FIG. 2. With indium phosphide and other materials having a zinc-blend crystal structure, a growth of the ingot in the $<111>_B$ direction requires slicing at an angle $\theta$ with respect to central axis 21 of about 35.3 degrees for yielding wafers that are desirably oriented in the <100> crystallographic direction. The slicing, as shown by the arrow 23, will yield wafers having a circular periphery if the angle $\theta$ is an angle having a sine equal to $y \div x$, where y and x are the ingot thicknesses along the minor and major axes, respectively. Thus, in the indium phosphide example, parameters x and y are chosen such that the sine of 35.3 degrees equals $y \div x$.

As mentioned above, it is customary, prior to slicing wafers from the ingot, to grind axially extending reference flats in the ingot. With indium phosphide, a primary flat may be ground so as to correspond to the (011) plane and the secondary flat as the (01$\bar{1}$) plane. In accordance with the invention, this grinding is avoided by simply forming the flat, or flats, in the crucible prior to ingot fabrication.

Figure 4:
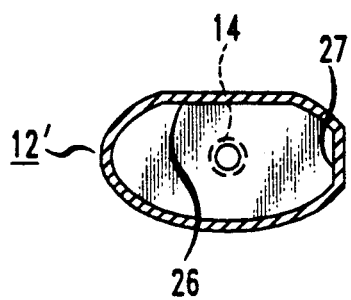
FIG. 4 is a top view of a crucible in accordance with one embodiment of the invention.
Figure 5:
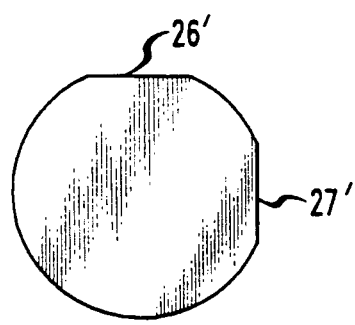
FIG. 5 is a view of a wafer sliced from an ingot made in the crucible of FIG. 4.

This is illustrated in FIG. 4 which is a sectional view of a crucible 12' containing a primary flat 26 and a secondary flat 27. The seed crystal is oriented in the seed well 14 such that, when the ingot is grown, it has a flat portion corresponding with primary flat 26 which is used as a primary reference flat for the ingot and another axially extending flat corresponding to secondary flat 27 which will constitute a secondary flat for the ingot. For indium phosphide, the ingot is grown such that primary flat 26 is parallel to the major axis of the crucible ellipse and corresponds to the (011) plane, and secondary flat 27 is parallel to the minor axis and corresponds to the (01$\bar{1}$) plane. Referring to FIG. 5, after the ingot has been sliced as described previously for yielding circular wafers, the wafers each contain primary and secondary reference flats 26' and 27' which may thereafter be used, in a known manner, for properly orienting devices to be formed in the wafer.

Figure 6:
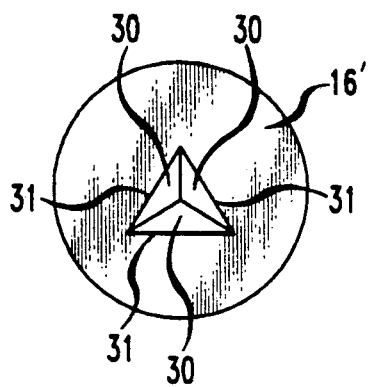
FIG. 6 is a schematic view of an etched pit in a monocrystalline semiconductor seed crystal that may be used for determining crystallographic orientation.
Figure 9:
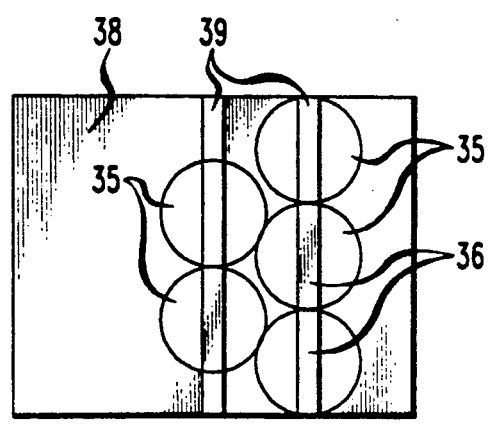
FIG. 9 is a schematic view of a method for making seed crystals in accordance with an embodiment of the invention.

For the reference flats 26 and 27 of FIG. 4 to be properly determinative of the crystal orientation of the ingot, it is necessary that the seed crystal be properly rotationally oriented within the seed well. Specifically, in the case of indium phosphide, the line of intersection of the {100} plane with the {111} plane should be aligned so as to be parallel to the major axis (x) of the crucible ellipse. A number of methods are known for making this determination, one example being the etch method, described for example, in the paper, "Review of Chemical Polishing of Semiconductors," B. Tuck, *Journal of Materials Science*, Vol. 10, (1975), pp. 321-339. Referring to FIG. 6, a pit etched in indium phosphide will have a triangular shape defined by planar facets 30, each being located in the {111} planes and inclined to the (111)$_B$ plane at 70.5 degrees. The edges of the pit are aligned along the <110> directions. Thus, one of the edges 31 of seed crystal 16' should be oriented to be parallel with the major axis of the ellipse defined by the crucible.

Figure 7:
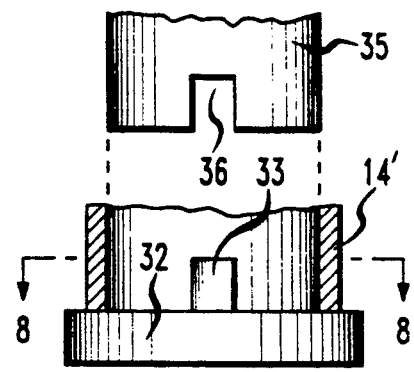
FIG. 7 is a schematic illustration of part of the seed well portion of the crucible of FIG. 3 together with a seed well cap portion in accordance with the invention.

In accordance with another feature of the invention, the level of operator skill needed for rotationally orienting the seed crystal in the seed well is significantly reduced by using meshing portions in the seed crystal and in the seed well of the crucible as shown in FIG. 7. Only a portion 14' of the seed well of the crucible is shown in FIG. 7. Rigidly attached at the bottom is a cap 32 containing a wall portion 33 that projects upwardly from the cap. The seed crystal 35 contains a slot 36 which is indicative of the crystal orientation of the seed crystal 35. The seed crystal 35 is placed into the seed well 14' such that the slot 36 meshes with the wall portion 33 and fits snugly over it, and when so positioned, the seed crystal is properly rotationally oriented within the seed well for crystal growth as described above.

Figure 8:
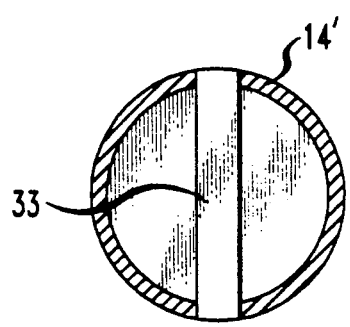
FIG. 8 is a view taken along lines 8—8 of FIG. 7.

Referring to FIG. 8 which is a view taken along lines 8—8 of FIG. 7, the wall portion 33 may fit snugly into a slot in the crucible seed well portion 14'. Thus, after the crucible is made, a slot is cut in the bottom of the seed well portion which is carefully oriented with respect to the major and minor axes of the elliptical portion of the crucible. The wall portion 33 fits snugly in the slot and holds the cap 32 to the crucible by friction. In this manner, crucibles can be produced of material such as boron nitride with interchangeable cap portions being used to define the wall portion 33. It can be appreciated that fitting the seed crystal 35 into the meshing seed well shown in FIG. 7 requires considerably less operator skill than would be required if the operator had to determine the crystal orientation of the seed crystal using a method such as that shown in FIG. 6.

If slot 36 is cut to be parallel with the line of intersection of the {100} plane with the {111} plane of the seed crystal 35, then wall portion 33 should be parallel with the major axis of the crucible ellipse. Alternatively, slot 36 can be cut to be parallel to the <112> direction, in which case wall portion 33 should be parallel to the minor axis of the ellipse. Referring to FIG. 8, a number of seed crystals 35 can be cut by "coring" in a known manner from a block of crystalline indium phosphide 38. The slots in the various seed crystals can be made by making slots 39 in the block 38, which bear a predetermined relationship to the crystal orientation of block 38. Then, when seed crystals 35 are cored from the block, they will contain slots 36 which are used in the manner depicted in FIG. 7.

While the invention has been discussed in the context of using the VGF method for making indium phosphide, it is to be understood that it is applicable to the growth of other semiconductor crystals, particularly group III-V and group II-VI semiconductors, and to other growing methods such as the known horizontal Bridgeman technique. The method of using one or more reference flats extending axially along the inner surface of a crucible may be used in conjunction with crucibles for making cylindrical ingots as well as elliptically shaped ingots, and it is not essential that the meshing feature of the seed crystal be used in any such embodiments. Various methods of interlocking or meshing the seed crystal with the crucible other than that specifically shown could alternatively be used. For example, a wall projection could be made in the seed crystal with a meshing slot formed in the crucible. The use of the meshing feature could be used in conjunction with cylindrical crucibles that may or may not have reference flats, as well as in conjunction with elliptically shaped crucibles that may or may not incorporate reference flats. Various other embodiments and modifications may be made by those skilled in the art without departing from the spirit and scope of the invention.

I claim:

1. A method for making wafers of a semiconductor material comprising the steps of: orienting a semiconductor seed crystal in a crucible such as to give a predetermined crystalline orientation to an ingot to be grown; including semiconductor raw material in the crucible in contact with the seed crystal; melting the raw material and part of the seed crystal; solidifying the molten seed crystal and raw material so as to grow a crystalline semiconductor ingot; making an axially extending flat surface in the ingot to serve as a reference flat for giving an indication of the crystal orientation of the ingot; and slicing the ingot into wafers, each wafer having a reference flat portion; wherein the improvement comprises:

making a first meshing portion in part of the crucible;

making a second meshing portion in the seed crystal such that the second meshing portion matches the first meshing portion and such that the second meshing portion bears a selected relationship to the crystalline orientation of the seed crystal;

the step of making the axially extending flat surface on the ingot comprises the step of providing a flat surface portion on part of the inner surface of the crucible, the orientation of the flat surface portion bearing a selected relationship to the orientation of the first meshing portion of the crucible; and the step of orienting the seed crystal comprises the step of meshing the second meshing portion with the first meshing portion such that the seed crystal is constrained to a specified orientation in the crucible.

2. The method of claim 1 wherein:

the first meshing portion is a projecting wall portion;

and the step of making the second meshing portion comprises the step of making a slot in the seed crystal having a thickness sufficient to permit it to fit snugly over the projecting wall portion.

3. The method of claim 1 wherein:

the seed crystal is located at one end of the crucible, the crucible having a central axis;

and the solidification step comprises the step of growing the ingot from the seed crystal in a selected first crystallographic direction substantially coincident with the central axis of the crucible.

4. The method of claim 3 further comprising the steps of:

constraining growth of a major portion of the ingot such that, in a section taken perpendicularly to the first crystallographic direction, the outer surface of the ingot, with the exception of the flat surface portion, substantially defines an ellipse.

5. The method of claim 4 wherein:

the ingot has a thickness x in the direction of the major axis of the ellipse and a thickness y in the direction of the minor axis of the ellipse;

and the slicing step comprises the step of repeatedly cutting the ingot in the direction of the minor axis and at a sufficient angle with respect to the first direction to yield wafers each having a substantially circular outer periphery.

6. The method of claim 5 wherein:

the first crystallographic direction is the <111> crystallographic direction;

and the angle at which the ingot is cut is substantially 35.3 degrees with respect to the first direction.

7. The method of claim 1 wherein:
the semiconductor is taken from the group consisting of group III-V semiconductor materials and group II-VI semiconductor materials.

8. The method of claim 7 wherein:
the semiconductor is indium phosphide.

9. The method of claim 2 wherein:
the step of growing the ingot comprises the step of including the seed crystal in a seed well at a lower end of the crucible;
and the solidification step comprises the step of progressively freezing the molten material in an upward direction from the seed crystal to form an ingot having a central axis coincident with the central axis of the crucible.

10. The method of claim 9 wherein:
the step of progressively freezing the molten material constitutes part of a VGF method for growing the ingot.

11. The method of claim 10 wherein:
the crucible comprises a seed well portion surrounding the seed crystal, a major portion defining the outer periphery of a major part of the ingot, and a transition portion interconnecting the major portion with the seed well portion of the crucible;
and the flat surface portion extends axially along substantially the entire length of the major portion of the crucible, whereby the flat surface of the ingot extends axially along substantially its entire useful length.

12. A method for making semiconductor wafers comprising the steps of: positioning a semiconductor seed crystal in a crucible; including semiconductor raw material in contact with one surface of the seed crystal; melting the raw material and part of the seed crystal; solidifying the raw material so as to grow a crystal semiconductor ingot having a crystal orientation determined by that of the seed crystal; making a flat surface portion on the ingot for giving an indication of the crystal orientation of the ingot; and slicing the ingot into wafers, each wafer having a reference flat portion, resulting from the flat portion on the ingot, for indicating the crystal orientation of the wafer; wherein the step of making the flat surface portion on the ingot comprises the steps of:
(a) prior to crystal growth, providing a flat portion on part of the inner surface of the crucible, whereby, after solidification, the ingot flat surface portion will correspond to the crucible flat portion; and
(b) prior to crystal growth, orienting the seed crystal in the crucible such that the flat surface of the crucible bears the same relation to the crystal orientation of the seed crystal as the flat surface of the ingot bears to the crystal orientation of the ingot.

13. The method of claim 12 wherein:
the crucible includes at one end thereof a seed well portion for containing the seed crystal;
and the flat inner surface portion of the crucible extends along a major portion of the length of the crucible.

14. The method of claim 13 wherein:
the step of growing the ingot comprises the step of including the seed crystal in a seed well at a lower end of the crucible;
and the solidification step comprises the step of progressively freezing the molten material in an upward direction from the seed crystal to form an ingot having a central axis coincident with the central axis of the crucible.

15. The method of claim 14 wherein:
the step of progressively freezing the molten material constitutes part of a VGF method for growing the ingot.

16. The method of claim 14 further comprising the steps of:
including in the seed well a first meshing portion adapted to mesh with part of the seed crystal;
providing in a seed crystal a second meshing portion adapted to mesh with the first meshing portion;
the first meshing portion being located so as to bear a selected relationship with the flat inner surface portion of the crucible;
and the step of orienting the seed crystal comprises the step of meshing the second meshing portion with the first meshing portion such that the seed crystal is constrained to a specific orientation in the crucible.

17. A method for making semiconductor wafers comprising the steps of:
providing in a crucible a flat inner surface portion extending along a major portion of the length of the crucible;
the crucible including at a lower end thereof a seed well portion for containing a seed crystal;
including in the seed well a first meshing portion adapted to mesh with part of the seed crystal;
providing in the seed crystal a second meshing portion adapted to mesh with the first meshing portion;
the first meshing portion being located so as to bear a selected relationship with the flat inner surface portion of the crucible;
and orienting the seed crystal in the seed well comprising the step of meshing the second meshing portion with the first meshing portion such that the seed crystal is constrained to a specific orientation in the crucible;
including semiconductor raw material in the crucible in contact with the seed crystal;
melting the raw material and part of the seed crystal and confining the molten material in the crucible such that it bears against at least part of the flat inner portion of the crucible;
progressively freezing the molten material in an upward direction from the seed crystal to form an ingot having a central axis coincident with the central axis of the crucible;
the freezing step constituting part of a VGF method for growing the ingot;
slicing the ingot into wafers, each wafer having a flat outer peripheral portion due to the flat outer surface portion of the ingot;
and using the flat outer peripheral portion of a wafer as a reference surface for determining the crystal orientation of such wafer.

18. The method of claim 17 wherein:
the seed well portion defines substantially a hollow cylinder section;
the seed crystal is made to have a generally cylindrical shape so as to fit snugly within the hollow cylinder section;

and the first and second meshing portions cooperate to constrain the angular orientation of the seed crystal within the hollow cylinder section.

19. The method of claim 18 wherein:
the first meshing portion is a projecting wall portion;
and the step of making the second meshing portion comprises the step of making a slot in the seed crystal having a thickness sufficient to permit it to fit snugly over the projecting wall portion.

20. The method of claim 19 further comprising the steps of:
constraining growth of a major portion of the ingot such that, in a section taken perpendicularly to the first crystallographic direction, the outer surface of the ingot, with the exception of the flat surface portion, substantially defines an ellipse.

21. The method of claim 20 wherein:
the ingot has a thickness x in the direction of the major axis of the ellipse and a thickness y in the direction of the minor axis of the ellipse;
and the slicing step comprises the step of repeatedly cutting the ingot in the direction of the minor axis and at a sufficient angle with respect to the first direction to yield wafers each having a substantially circular outer periphery.

22. A method for making wafers of a semiconductor material comprising the steps of: orienting a semiconductor seed crystal in a crucible such as to give a predetermined crystalline orientation to an ingot to be grown; including semiconductor raw material in the crucible in contact with the seed crystal; melting the raw material and part of the seed crystal; solidifying the molten seed crystal and raw material so as to grow a crystalline semiconductor ingot; and slicing the ingot into wafers of a selected crystal orientation; wherein the improvement comprises:
making a first meshing portion in part of the crucible;
making a second meshing portion in the seed crystal such that the second meshing portion matches the first meshing portion and such that the second meshing portion bears a selected relationship to the crystalline orientation of the seed crystal;
and the step of orienting the seed crystal comprises the step of meshing the second meshing portion with the first meshing portion such that the seed crystal is constrained to a specified orientation in the crucible.

23. The method of claim 22 wherein:
the first meshing portion and the second meshing portion are each chosen from the group consisting of a projecting wall portion and a slot adapted to fit snugly over the projecting wall portion.

24. The method of claim 23 wherein:
the first meshing portion is a projecting wall portion;
and the step of making the second meshing portion comprises the step of making a slot in the seed crystal having a thickness sufficient to permit it to fit snugly over the projecting wall portion.

25. The method of claim 23 wherein:
the seed crystal is located at one end of the crucible, the crucible having a central axis;
and the solidification step comprises the step of growing the ingot from the seed crystal in a selected first crystallographic direction substantially coincident with the central axis of the crucible.

26. The method of claim 25 further comprising the steps of:
constraining growth of a major portion of the ingot such that, in a section taken perpendicularly to the first crystallographic direction, the outer surface of the ingot substantially defines an ellipse.

27. The method of claim 26 wherein:
the ingot has a thickness x in a direction of the major axis of the ellipse and a thickness y in the direction of the minor axis of the ellipse;
and the slicing step comprises the step of repeatedly cutting the ingot in the direction of the minor axis and at a sufficient angle with respect to the first direction to yield wafers each having a substantially circular outer periphery.

28. The method of claim 27 wherein:
the first crystallographic direction is the <111> crystallographic direction;
and the angle at which the ingot is cut is substantially 35.3 degrees with respect to the first direction.

29. The method of claim 27 wherein:
the semiconductor is taken from the group consisting of a group III-V semiconductor material and a group II-VI semiconductor material.

30. The method of claim 22 wherein:
the method of growing the ingot comprises the step of including the seed crystal in a seed well at the lower end of the crucible, the crucible being vertically oriented;
and the solidification step comprises the step of progressively freezing the molten material in an upward direction from the seed crystal to form an ingot having a central axis coincident with the central axis of the crucible.

31. The method of claim 24 wherein:
the step of making the slot in the seed crystal comprises the step of making a plurality of slots in a crystal body and then cutting the body into a plurality of seed crystals each having a slot therein.

* * * * *